US008932554B2

(12) United States Patent
Boudou et al.

(10) Patent No.: US 8,932,554 B2
(45) Date of Patent: Jan. 13, 2015

(54) METHOD TO PRODUCE LIGHT-EMITTING NANO-PARTICLES OF DIAMOND

(71) Applicant: INSERM (Institut National de la Sante et de la Recherche Medicale), Paris (FR)

(72) Inventors: Jean-Paul Boudou, Chaville (FR); Patrick Curmi, Clamart (FR)

(73) Assignees: INSERM (Institut National de la Sante et de la Recherche Medicale), Paris (FR); Universitat Stuttgart, Stuttgart (DE); Armines, Paris (FR)

(*) Notice: Subject to any disclaimer, the term of this patent is extended or adjusted under 35 U.S.C. 154(b) by 0 days.

(21) Appl. No.: 14/015,179

(22) Filed: Aug. 30, 2013

(65) Prior Publication Data
US 2014/0065424 A1  Mar. 6, 2014

Related U.S. Application Data

(62) Division of application No. 12/597,984, filed as application No. PCT/EP2008/055647 on May 7, 2008, now Pat. No. 8,574,536.

(30) Foreign Application Priority Data

May 10, 2007   (EP) .................................... 07290593

(51) Int. Cl.
*B01J 3/06* (2006.01)
*C01B 31/02* (2006.01)
(Continued)

(52) U.S. Cl.
CPC ............... *C01B 31/065* (2013.01); *C30B 33/02* (2013.01); *C30B 29/04* (2013.01); *C09K 11/65* (2013.01); *Y10S 977/775* (2013.01); *Y10S 977/949* (2013.01)

USPC ........ 423/446; 423/445 R; 423/384; 204/173; 252/301.36; 428/402; 977/775; 977/949

(58) Field of Classification Search
None
See application file for complete search history.

(56) References Cited

U.S. PATENT DOCUMENTS 4,880,613 A   11/1989   Satoh
4,985,226 A   1/1991    Satoh et al.
(Continued)

FOREIGN PATENT DOCUMENTS

| CA | 2416522 | 1/2003 |
|---|---|---|
| EP | 0347772 | 12/1989 |
| JP | H04132606 | 5/1992 |

OTHER PUBLICATIONS

Beveratos et al., "Nonclassical radiation from diamond nanocrystals," Phys. Rev. A., 64:061802-1-061802-1-4 (2001) XP002456037.

(Continued)

*Primary Examiner* — Guinever Gregorio
(74) *Attorney, Agent, or Firm* — McAndrews, Held & Malloy Ltd.

(57) ABSTRACT

Method to produce diamonds containing Nitrogen-Vacancy centers from diamonds grown by a high pressure and high temperature process and containing isolated substitutional nitrogen, comprising: —Irradiating (12) said diamonds by an electron beam such that the irradiation dose is comprised between $10^{17}$ and $10^{19}$ electrons per square centimeter; —annealing (14) the irradiated diamonds in vacuum or in a inert atmosphere at a temperature above 700° C. and for at least 1 hour; characterized in that said electron beam has an acceleration energy above 7 MeV.

11 Claims, 3 Drawing Sheets

(51) Int. Cl.
*C01C 3/00* (2006.01)
*C01B 31/00* (2006.01)
*C09K 11/02* (2006.01)
*B32B 5/16* (2006.01)
*C01B 31/06* (2006.01)
*C30B 33/02* (2006.01)
*C30B 29/04* (2006.01)
*C09K 11/65* (2006.01)

(56) References Cited

U.S. PATENT DOCUMENTS

| | | | |
|---|---|---|---|
| 5,523,071 | A | 6/1996 | Jackson et al. |
| 5,637,878 | A | 6/1997 | Herer et al. |
| 6,860,914 | B2 | 3/2005 | Davies et al. |
| 7,416,141 | B2 | 8/2008 | Dobbs |
| 8,110,171 | B1 | 2/2012 | Roy et al. |
| 2005/0008560 | A1 | 1/2005 | Kataoka et al. |
| 2008/0118966 | A1* | 5/2008 | Chang et al. ............... 435/173.1 |
| 2010/0181534 | A1* | 7/2010 | Shenderova et al. ...... 252/301.16 |
| 2012/0051996 | A1 | 3/2012 | Scarsbrook et al. |

OTHER PUBLICATIONS

De Weerdt et al., "Sub-threshold excitation of luminescence of defects in diamond," J. Phys.: Condens. Matter, 17:8005-8015 (2005) XP002456383.

Fu et al., "Characterization and application of single fluorescent nanodiamonds as cellular biomarkers," PNAS, 104 (3):727-732 (2007) XP002456036.

Gruber et al., "Scanning Confocal Optical Microscopy and Magnetic Resonance on Single Defect Centers," Science, 276:2012-2014 (1997) XP002456035.

Uedono et al., "Annealing behaviours of defects in electron-irradiated diamond probed by positron annihilation," J. Phys.: Condens. Matter II, pp. 4925-4934 (1999) XP002456366.

Vlasov et al., "Relative Abundance of Single and Vacancy-Bonded Substitutional Nitrogen in CVD Diamond," phys. Stat. sol. (a), 181:83-90 (2000) XP002456034.

Yu et al., "Bright fluorescent nanodiamonds: no photobleaching and low cytotoxicity," J. Am. Chem. Soc., 127 (50):17604-17605 (2005).

* cited by examiner

METHOD TO PRODUCE LIGHT-EMITTING NANO-PARTICLES OF DIAMOND

The present application is a divisional application of U.S. patent application Ser. No. 12/597,984 filed Oct. 28, 2009, which was a filed pursuant to 35 U.S.C. §371 as a U.S. National Phase application of International Patent Application No. PCT/EP08/55647, which was filed May 7, 2008, claiming the benefit of priority to European Patent Application No. 07290593.8, filed on May 10, 2007. The entire text of the aforementioned applications is incorporated herein by reference in its entirety.

FIELD OF THE INVENTION

The present invention relates to light-emitting diamonds and method for producing the same. It relates also to powder of such light-emitting diamonds and use of the same.

BACKGROUND OF THE INVENTION

Most frequent points defects in as grown cubo-octahedral high-pressure and high-temperature (HPHT) diamond crystal are the following:
- vacancy (V), a defect caused by an atom missing from a lattice site;
- interstitial, when an extra atom is introduced in the structure at a position between normally occupied lattice sites, for instance an interstitial nitrogen atom ($N_I$).
- substitutional, which involves the replacement of an atom of a specific type by an atom of a different type, for instance, isolated/single substitutional nitrogen atom ($N_S$) replacing a carbon atom.

Nitrogen-Vacancy (N-V) centres are formed by combining $N_S$ with V. The N-V centre absorbs excitation light in a wavelength range of 480 to 638 nm and emits luminescence in a wavelength range of 638 to 780 nm. To form the N-V centre in the diamond, a rough diamond containing $N_S$ is irradiated by an electron beam having an energy of few MeV, typically less than 4 MeV, to generate Lattice defects. Then, the irradiated diamond is annealed to combine the lattice defect with the nitrogen atom to form the N-V centre. During annealing, the vacancies move by a thermally-activated jump from one lattice site to the next. The probability of making this jump is $v \exp[-E_a/(k_B T)]$ where v is the "attempt-to-escape frequency" and $E_a$ is the activation energy. In a type Ib (i.e. discrete dispersion type) diamond, this random walk continues until a vacancy V encounters a isolated nitrogen atom $N_S$, where it is trapped to form a N-V centre. There are limitations to N-V centre formation and uniformity that can be produced as a consequence of competitive defect formation and because of the strong growth sector dependence associated with the concentration of defects such as nitrogen in diamond.

The N-V centre in diamond is one of those defect studied in most detail. It has C3v symmetry, with the symmetry axis oriented along the crystallographic [111] axis. The main photo physical parameters of the N-V centre indicate the suitability of the system for single centre detection; they have a large absorption cross section at the excitation wavelength, a short excited-state lifetime, and high quantum efficiency for radiative relaxation. In addition, no efficient shelving in a metastable state has been reported for N-V centres at room temperature, although the high spectral hole-burning efficiency at low temperature indicates existence of this process. This colour centre has the great advantage of being photostable and do not exhibit any photoblinking when exposed to a laser at 532 nm, with a typical intensity in the range of few mW $cm^{-2}$. Untreated samples of synthetic Ib diamond provide a concentration of N-V centers well suited for addressing individual centres.

The U.S. Pat. No. 4,880,613 discloses a light emitting element comprising diamond which contains N-V centres and optionally H3 colour centres (N-V-N). The disclosed method to manufacture such diamond implies an electron beam of energy of 2 to 4 MeV and a dose of $1 \times 10^{17}$ to $2 \times 10^{18}$ electrons*$cm^{-2}$ for generation of N-V centres. With such acceleration energy, the electron beam is not efficient when the thickness of diamond is above 3 or 4 millimeters. Therefore, document U.S. Pat. No. 4,880,613 suggests to use a neutron beam when the thickness of diamond is larger. It means that the quantity of diamonds that can be irradiated by an electron beam in a single batch is limited to the volume defined by the scanning area of the electron beam and a depth ≤3 mm.

A significant limitation in bulk diamond is that the light is emitted in a high index material, that makes its efficient extraction difficult. Refraction at the sample interface leads to a small collection solid angle and to aberrations. The sub-wavelength size of nanocrystals renders refraction irrelevant. A nanocrystal may be thought of as a point source emitting light in air. Gruber et al., "Scanning Confocal Optical Microscopy and Magnetic Resonance on Single Defect Centres", Science 276, 2012-2014, 1997 is the first paper to describe N-V centres in diamond nanocrystals using confocal microscopy, magnetic resonance, photoluminescence, etc.

A promising system for a robust single photon source is provided by individual nitrogen-vacancy colour centres (N-V centres) in diamond. Light sources able to emit individual photons on demand would be of great potential use for quantum cryptography. A quantum computation scheme requiring such sources has also been proposed recently. Considerable activity is thus dedicated to designing and implementing efficient, robust, room-temperature sources delivering a periodic train of pulses containing one and only one photon. These sources are based on the property of a single emitting dipole to emit only one photon at a time. When excited by a short and intense pulse, such an emitter delivers one and only one photon. After pioneering experiments have demonstrated photon antibunching and conditional preparation of single-photon states, followed by first attempts to build triggered single photon sources, the present generation of experiments is concentrating on solid-state schemes better suited for practical use, such as single organic molecules, self-assembled semiconductor quantum dots, or semiconductor nanocrystals. The successful candidate should work at room temperature, and be photostable. In this framework, for instance, Beveratos et al, "Nonclassical radiation from diamond nanocrystals", Phys. Rev. A 061802, 1-4. (2001) discloses a preparation of nanocrystals from synthetic diamond powder bought from de Beers. The defects were created by irradiation with 1.5 MeV beam at a dose of $3 \times 10^{17}$ $cm^{-2}$ electrons, and annealing in vacuum at 850° C. during 2 hours. The nanocrystals were dispersed by sonification in a solution of polymer Polyvinylpyrrolidone at 1 wt. % in propanol. This allows the disaggregation of the particles and their stabilization in a colloidal state. Centrifugation at 11 000 rpm for 30 mn allows the authors to select nanocrystal sizes of 90±30 nm measured by dynamical light scattering. The average number of N-V centres in a nanocrystal has been evaluated to 8. The density of N-V centres created is then estimated to be of one in a theoretical 30 nm diameter sphere.

Biological fluorescent probe, such as organic dyes, fluorescent proteins and fluorescent semiconductor nanocrystals (or quantum dots), are able to absorb light at a wavelength longer than 500 nm and emit light at a wavelength longer than 600 nm, at which the emission has a long penetration depth through cells and tissues. These probes have several detrimental properties, such as photobleaching and blinking or cytoxicity and chemical instability (complicated quantum dot surface chemistry). On the other hand, it has been shown recently that diamond nanocrystals bearing intracrystalline N-V centre, which are known to absorb strongly at around 560 nm and emits fluorescence efficiently at around 700 nm, which is well separated from the spectral region where endogenous fluorescence occurs, are nontoxic, and allow long-term monitoring of a single diamond nanoparticle in a biological cell. Yu et al., "Bright fluorescent nanodiamonds: no photobleaching and low cytotoxicity", J Am Chem Soc. 21, 17604-5 (2005) produced highly fluorescent nanodiamonds (FND) with low cytoxicity from synthetic type Ib diamond powders with a nominal size of 100 nm by irradiation with a 3 MeV proton beam at a dose of $5\times10^{15}$ ions/cm$^2$ and subsequent annealing at 800° C. in vacuum for 2 h. Wei P. and al., "Characterization and application of single fluorescent nanodiamonds as cellular biomarkers", PNAS 104, 727-732, (2007) prepares fluorescent diamond nanoparticles from synthetic Ib type diamond particles of 35 or 100 nm by proton irradiation (3 Mev, $10^{16}$ cm$^{-2}$ ions), subsequent annealing in vacuum at 700° C. for 2 h, removal of non-diamond shell and surface functionalization with carboxylic or amino groups. The authors showed that the fluorescence of a single 35 nm diamond is significantly brighter than that of a single dye molecule such as Alexa Fluor 546. The latter photobleached in the range of 10 s at a laser power density of 104 W cm$^{-2}$, whereas the nanodiamond particle showed no sign of photobleaching even after 5 min of continuous excitation. Furthermore, no fluorescence blinking was detected within a time resolution of 1 ms. The photophysical properties of the particles did not deteriorate even after surface functionalization with carboxyl groups, which form covalent bonding with polyL-lysines that interacts with DNA molecules through electrostatic forces. The feasibility of using surface-functionalized fluorescent nanodiamonds as single-particle biomarkers was demonstrated with both fixed and live HeLa cells.

SUMMARY OF THE INVENTION

Therefore, it would be advantageous to achieve a process able to produce large samples of diamonds with N-V centers at low cost. And particularly, it would be advantageous to produce nanodiamonds which can be used as emitter for several applications: molecular marker (Nucleic acids, proteins, lipids, glucides, drugs etc. . . . ), fluorescent tag for drug vectorization, analytical chemistry, photoluminescent coating of material, quantum cryptography, etc.

To better address one or more concerns, in a first aspect of the invention a method to produce diamonds containing Nitrogen-Vacancy centres from diamonds having a size above 150 micrometers grown by a high pressure and high temperature process and containing isolated substitutional nitrogen, comprising:
- irradiating said diamonds by an electron beam such that the irradiation dose is comprised between $10^{17}$ and $10^{19}$ electrons per square centimeter;
- annealing the irradiated diamonds in vacuum or in a inert atmosphere at a temperature above 700° C. and for at least 1 hour;

characterized in that said electron beam has an acceleration energy above 7 MeV.

The method is advantageously capable of generating nanocrystals of diamond with a controlled N-V centre concentration by starting from as grown high-pressure/high-temperature (HPHT) diamond. These photoluminescent nanoparticles are useful in electronic, optical, biological, coating, analytical chemistry and other applications.

The method advantageously has a higher throughput than the classical method as the higher acceleration energy enables the irradiation of a thick layer of diamonds, above few millimeters, typically one centimeter and more.

The method has also the advantage to increase the density of light-emitting centres as a high-energy electron generates more vacancies.

In a second aspect of the invention, a light emitting diamond having Ib type nitrogen atoms contains more than 30% of nitrogen centres which are light-emitting elements.

The light-emitting diamond having a higher density of light-emitting elements, nano-particles based on the diamond are advantageously better biological markers.

These and other aspects of the invention will be apparent from and elucidated with reference to the embodiment described hereafter where:

DETAILED DESCRIPTION OF THE PREFERRED EMBODIMENTS

Figure 1:
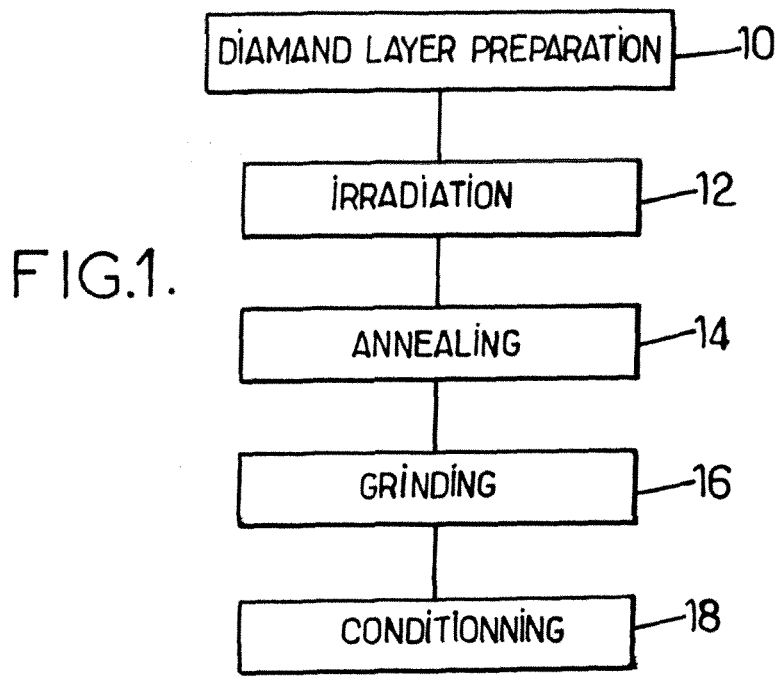
FIG. 1 is a flow chart of an embodiment of the method according to the invention.

In reference to FIG. 1, according to an embodiment of the invention, a box is filled up, at step 10, of diamonds of Ib type.

As mentioned previously, diamonds of Ib type are synthetic diamonds produced by high temperature high pressure (HPHT) process. Size of raw diamonds is superior to 0.1 micron—typically 80-100 meshes.

The box is made of aluminium alloy (e.g. Dural) or polyimide (e.g. Vespel). The box equipped with a cooling system (flowing cold water) has a variable form which depends on the characteristics of the electron beam equipment which will be used to irradiate the diamonds. Typically, the container has a parallelepiped or toric form. The layer thickness is adjusted using the depth-dose profiles presented in FIG. 2, for a given beam energy and areal diamond density or depth—expressed in g cm$^{-2}$.

Figure 2:
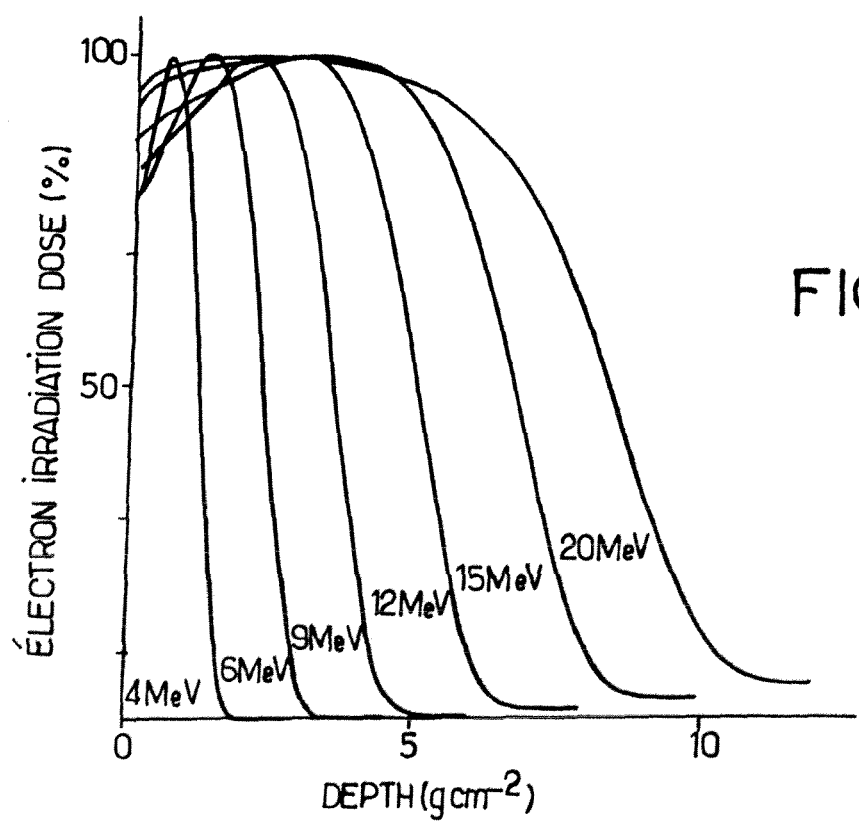
FIG. 2 is a diagram of irradiation dose absorbed by diamonds function of the depth of diamond layer and irradiation energy of electron beam.

As shown in FIG. 2, between 5 and 15 MeV, the stopping power in diamond, given by the Bethe-Bloch formula, increases from around 1.7 to 2 MeV cm$^2$ g$^{-1}$. A given energy deposition or irradiation dose being assumed to be equal to the incident electron fluence, and approximated by the energy loss, increases more than proportional with the beam energy.

At step 12 of FIG. 1, the box containing diamonds is irradiated by an electron beam at acceleration energy between 7 MeV and 15 MeV and incident electron fluence above $10^{18}$ e$^-$ cm$^{-2}$.

As the irradiation generates heat into the container and the diamond, a flow of water, is used to keep the diamond sample below 80° C. to avoid container and sample damage during the irradiation. Water is a much better cooling fluid than air for thick layer of 1 cm and above exposed to high energy electron beam. However, above an irradiation dose of $10^{19}$ cm$^{-2}$ electrons, to keep short irradiation time, beam intensity increase makes sample cooling more difficult, so that irradiation time becomes longer to introduce an excess of vacancies in $N_S$ rich diamond lattice. For instance, with a beam intensity of 5 μA cm$^{-2}$ (1 μA is approximately equal to $6.24 \times 10^{12}$ e$^-$ s$^{-1}$), it would take about 90 hours of irradiation to get a dose of $10^{19}$ e$^-$ cm$^{-2}$. Electron beam energy above 7 MeV has the advantage to irradiate more homogeneously the thick diamond sample contained in the reaction box. High electron beam energy, up to 15 MeV, can be advantageously used without triggering nuclear reactions and inducing residual radioactivity either of the metallic impurities (catalyst) or of the light elements contained in the synthetic diamond.

As shown in FIG. 2, higher beam energy authorizes to use a thicker diamond layer. For instance, for a dose superior to 60% of the maximal irradiation dose, the maximal depth is about 1 g cm-2 at 4 MeV and about 5 g cm-2 at 12 MeV. Another advantage of high beam energy is also exemplified in FIG. 2: there is a better spread of irradiation dose for different depth due to an increase tailing of the depth-dose profile corresponding to a slower decrease of electron density in the beam of higher energy. Consequently, the diamond mass to irradiate in one batch is increases with the beam energy. For instance, in Electron Beam Technologies (http://www.electronbeam.com/#irradiation), electron beam with an irradiation beam energy of 1.5 MeV has a scanning area of the electron beam of 240 square centimeters. For 80 to 100 mesh diamond grit, the maximal sample mass, spread over 240 square centimeters, is 96 gram per batch. In the smaller Ionisos facility (http://www.ionisos.com/), the electron beam has irradiation beam energy of 10 MeV and a scanning area of 400 square centimeters. With the same type of diamonds (density 2.3), the maximal sample mass is about one kilo of diamonds per batch.

At step 14, FIG. 1, irradiated diamonds are annealed in vacuum or in a inert atmosphere at a temperature above 700° C., typically between 800° C. and 850° C. The required annealing time is at least 1 hour, typically annealing conditions comprised time interval between 1 and 2 hours.

Annealing is practised in vacuum or in an inert atmosphere to avoid oxidation on diamond surface. The only objective of the annealing step of coarser diamond particle is to rearrange lattices and create N-V centres. Annealing in flowing nitrogen at atmospheric pressure has the advantage to be easier and cheaper where compared to treatment in vacuum. At step 16, annealed diamonds are grinded to nanoparticles having a size of either less than one micron or less than 100 nanometers. Grinding on standard available industrial grinding mills requires a minimal amount of 250 grams which only be produced by irradiation with high beam energy.

Figure 3:
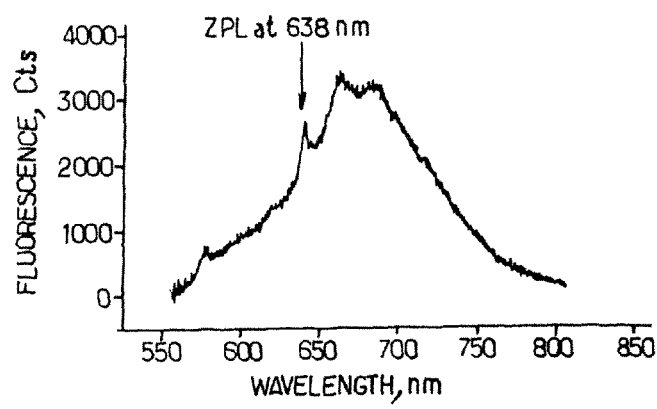
FIG. 3 displays diagrams of light emission of diamonds produced by the method according to FIG. 1 when illuminated by a frequency doubled Nd-YAG laser at 532 nm.

At step 18, such diamond particles are conditioned, for instance, by dispersion in liquid media such as pure water or introduced in a solid media to make a composite. The N-V containing diamonds obtained with the described method are pink/red. If illuminated by a green light, they become fluorescent for unlimited time, emitting a red light. FIG. 3 shows fluorescence emission spectrum of a HPHT diamond nanocrystal (8 MeV, $2 \times 10^{18}$ cm$^{-2}$ electrons, 820° C., 1 h). Excitation laser is at 532 nm. The spectrum shows emission which is typical for N-V defects. Such spectrum consists of relatively sharp zero-phonon line at 637 nm accompanied by broad phonon sidebands extending in the red-shifted region of the spectrum.

Figure 4A:
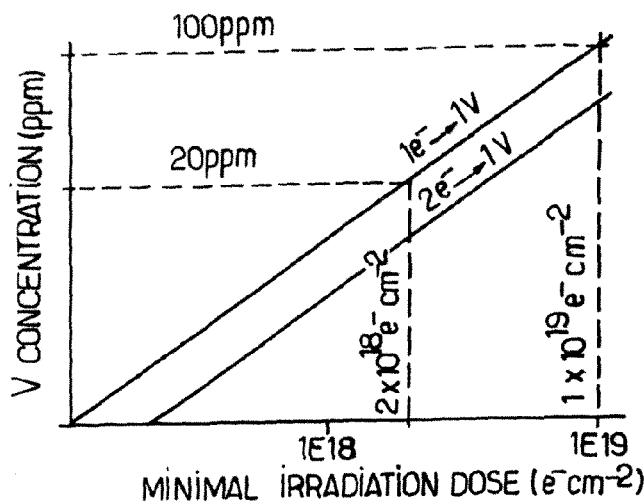
FIGS. 4A, 4B and 4C are diagrams giving the number of potential N-V centres per diamond nanocrystal.
Figure 4B:
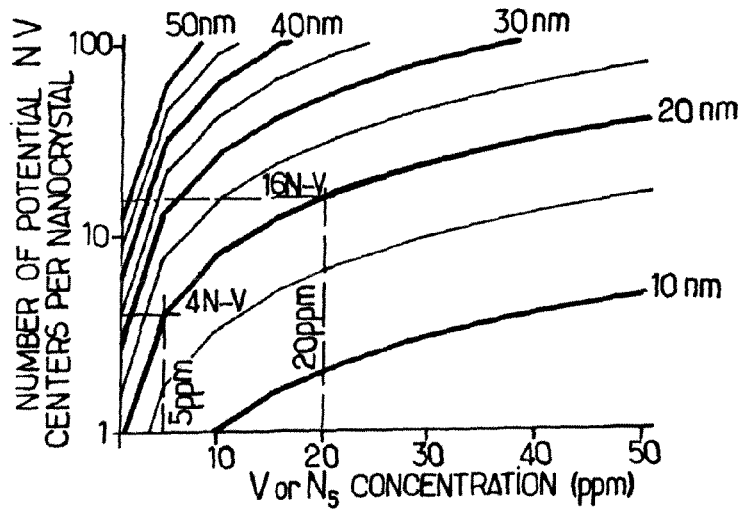
Figure 4C:
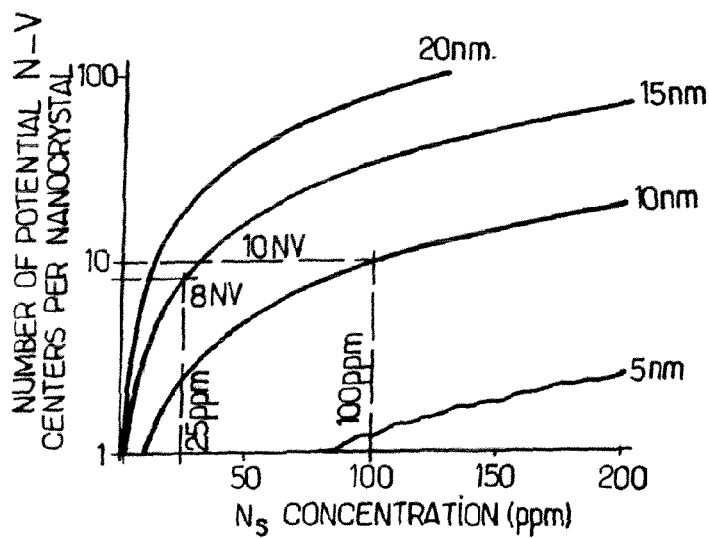

The use of high electron beam energy has double advantages. The first advantage is the creation of great number of vacancies able to combine with isolated substitutional nitrogen atoms ($N_S$) to create N-V centres. The second advantage, as a big sample can be irradiated in one step, is to permit the steps of post irradiation, i.e. annealing and grinding, necessary to produce diamond nanoparticles containing N-V centres. FIG. 4B shows that an irradiation dose of $2 \times 10^{18}$ e$^-$ cm$^{-2}$ is able to introduce about 4 to 16 N-V centres in a 20 nm diamond crystal and an irradiation dose of $1 \times 10^{18}$ e$^-$ cm$^{-2}$ would result in 10 N-V centres in a 10 nm nanocrystal and 8 N-V in a 15 nm one. Such high irradiation doses can only be used with as grown HPHT diamond crystals. The same type of irradiation applied to commercial diamond nanopowders produces an amorphization-aggregation of the nanoparticles. Several preliminary experiments have being made to compare different types of irradiation (electron, proton, neutron, etc.) and several types of HPHT diamond grits as possible raw material to produce diamond nanoparticles with N-V centres. The result of these tests is that electron irradiation-annealing-grinding of as grown HPHT diamond crystals appears to be the best methodology. In contrast, the same treatments applied to HPHT diamond nanopowders, which have surface functional groups, produce N-V containing aggregated and non-diamond carbon contaminated nanoparticles.

A first series of experiments used the electron beam facility of Institute for Nuclear Sciences (http://ssf.ugent.be/linac/linac/contact.php) by performing a preliminary electron irradiation with beam energy of 8 MeV and a fluence increasing from $5 \times 10^{17}$ to $1 \times 10^{19}$ cm$^{-2}$ electrons. Small samples were produced (200-300 mg) from:

commercial HPHT 80-100 mesh diamond microparticles (e.g. e6 PDA 999 80-100; http://www.e6.com). Number of $N_S$ per nanocube, assumed to become nanocrystals in this diamond has not been measured but can be estimated to be <100 ppm (around $10^{19}$ atoms cm$^{-3}$).

commercial HPHT 0 to 50 nm diamond nanoparticles (SYP 0-0.05; www.vanmoppes.ch). The mean particle size of this diamond is around 40 nm. Acid treatment used to remove the contamination introduced by milling of the raw HPHT microdiamonds has left a high density of surface functional groups. $N_S$ concentration in this diamond has not been measured but can be estimated to be <100 ppm (around $10^{19}$ atoms cm$^{-3}$).

For the 80-100 mesh diamond microparticles, before the experiment, light absorption of $N_S$ present in the initial diamond material lies at 400-500 nm which renders the diamond, clear yellow (complementary colour).

Electron irradiation produces vacancies by moving the carbon atoms, pushing them into the interstitial position. In diamond containing $N_S$, irradiation initially produces vacancies in the negative charge state (because $N_S$ is an electrical donor). The negative vacancy (V$^-$ gives rise to the "ND1" absorption band, in the ultraviolet part of the spectrum, so that Ib diamond remains yellow until the point where the vacancy concentration exceeds the initial concentration of $N_S$.

At this point, irradiation produces vacancies in the neutral status (V°). The absorption occurring with the vacancies in neutral status results in the absorption at 741 nm of GR1 centre (General Radiation) absorbing red and hence showing its complementary colour, green or blue green colour. Therefore, the green colour occurring after electron irradiation of the microdiamond PDA 999 80-100, would indicate that electron irradiation have induced the formation of nitrogen interstitial complexes, where nitrogen occupies a position midway between two nearest neighbour carbon atoms, displaced off the axis between them (Collins and Dahwich, "The production of vacancies in type Ib diamond", J. Phys.: Condens. Matter. 15, L591-L596, 2003), explaining the green colour in spite of the relatively low irradiation dose with respect to the initial $N_S$ concentration in the whole diamond or in some growth sectors.

After electron irradiation (8 MeV, fluence from $2\times10^{18}$ to $1\times10^{19}$ cm$^{-2}$ electrons) and annealing (flowing helium at 820° C. during one hour) a purple/pink colour is induced. The purple/pink colour is related to absorption of N-V defects around 575-637 nm (1.95-2.15 eV), confirmed by fluorescence spectroscopy. However under optical microscope, the diamond crystal appeared to be unequally coloured due to the initial heterogeneous nitrogen distribution as disclosed in Collins and al. document referenced hereabove. Electron irradiation alone appears to enhance the amount of green-orange photoluminescence under blue excitation which is naturally present but very weak. Subsequent annealing strongly attenuates this photoluminescence and creates N-V$^0$ and N-V$^-$ red-infrared emitting colour centres under a green excitation. The relative amount of N-V$^0$/N-V$^-$ depends on irradiation parameters. The negative charge in N-V$^-$ centre is thought to come from neighbouring nitrogen atoms: creation of an excess of vacancies results in a lower number of available nitrogen atom not already engaged in a N-V$^-$ centre, resulting in a higher proportion of N-V$^0$. Crystalline defects may be numerous in such microcrystals: no Raman line was observed neither at 532 nm nor at 473 nm excitation wavelengths, on none of the sample, including the non irradiated microcrystals.

Irradiation and annealing of commercial HPHT diamond powder SYP 0-0.05, in the same conditions as those applied to HPHT microdiamonds, initially showed problems related to formation of non-diamond layer on the surface. Such non-diamond carbon causes aggregation of nanocrystals into particles with a typical size of a few micrometers. Treatment of the samples in boiling mixture of sulphuric, nitric and perchloric acids results in partial diamond purification. Further characterization of single nanoparticles was performed using atomic force microscope combined with confocal optical microscope. Such combined study allows exploring correlation between optical and structural properties of single diamond nanocrystals. Hence irradiated and annealed nanocrystals can be considered as fluorescence marker. The exact number of N-V defects per nanocrystals was determined by time-resolved measurements of photon antibunching (data not shown). On average, after electron irradiation at 8 MeV (fluence $2\times10^{18}$ cm$^{-2}$ electrons) and annealing at 820° C., half of diamond particle do not fluoresce and 50 nm single nanocrystals only contains two N-V defects in average. Irradiation at higher dose ($1\times10^{19}$ cm$^{-2}$ electrons) produces stronger aggregation-amorphization and lower N-V introduction yield.

The comparison of the two experiments between microcrystals and nanocrystals demonstrates that better results are obtained by using microcrystals.

Figure 5:
FIG. 5 is a scanning electron image of a 80-100 mesh diamond after irradiation, annealing and pre-grinding in an opposed jet mill.

After these two experiments at 8 MeV, an industrial experiment has used the Ionisos electron accelerator (http://www.ionisos.fr). The maximum electron beam of this facility has irradiation beam energy of 10 MeV with a scan area of around 400 cm$^2$. In this test two Dural boxes of 125×80×10 millimeters were filled up with Ib type diamonds of 80 to 100 meshes (density ~2.3) for a total of 250 grams. During irradiation, a water flow cooled diamond containers. To irradiate diamonds at an irradiation dose of $2\times10^{18}$ cm$^{-2}$ electrons, the diamonds were irradiated for 18 hours (mean intensity: 5 μA/cm$^2$). Irradiated diamond powder shows radioactivity level that is well below the safety level imposed by the law. After an annealing step at around 820° C. for 1 hour, diamonds were grinded using industrial techniques. In a first step, microdiamonds containing N-V were autogenously grinded into 200-300 nm particles (with a small fraction of smaller nanoparticles, as shown in FIG. 5) by N$_2$ opposed jet milling by Alpine Hosokawa (experiment performed at Alpine Hosokawa, http://www.alpinehosokawa.com). After this first grinding step, nanoparticles of less than 50 nm were easily obtained by planetary milling (experiment performed at Fritsch, www.fritsch.de) or by autogenous milling in a stirred media milling with pure water (experiment performed at Alpine Hosokawa, http://www.alpinehosokawa.com).

Photoluminescence analysis of the nanoparticles shows that four incident electrons create one N-V centre (instead of the usual "rule of thumb" saying that one N-V is formed per incident electron) probably as a result of low fluence-dose conversion coefficient, low production vacancy yield, nitrogen-vacancy aggregation rate, etc.

A last experiment used a 15 MeV electron beam in Institut für Kernphysik Universität Mainz (http://www.kph.uni-mainz.de/). Before photoluminescence investigation, Geiger counter radioactivity analysis has been practised with high electron irradiation dose (from $2\times10^{18}$ to more than $10^{19}$ cm$^{-2}$ electrons, on two types of HPHT microdiamonds prepared with different metal addition, as metal particles contained in diamonds may generate radioactive elements of long life time. After hours or days of treatment, the analysis does not showed any detectable induced radioactivity.

All processed samples with the 15 MeV beam and with an irradiation up to $1\times10^{19}$ cm$^{-2}$ electrons did not show any sign of amorphization (checked by Raman and XRD spectroscopy) and displayed an intense photoluminescence excitation spectrum as in FIG. 3.

While the invention has been illustrated and described in details in the drawings and foregoing description, such illustration and description are to be considered illustrative or exemplary and not restrictive; the invention is not limited to the disclosed embodiment.

For instance, the grinding step may be practised before the irradiation step or before the annealing step. However, to grid the diamonds after annealing appears to create fluorescent diamonds of better quality. Other variations to the disclosed embodiments can be understood and effected by those skilled in the art in practising the claimed invention, from the study of the drawings, the disclosure and the appended claims.

Efforts have been made to ensure accuracy with respect to numbers (e.g., amounts, temperatures, rates, times, etc.) but some errors and deviations should be accounted for.

In the claims, the term "comprising" does not exclude other elements and the indefinite article "a" or "an" does not exclude a plurality.

The invention claimed is:

1. A powder of diamonds containing Nitrogen-Vacancy centres comprising nano-particles of diamonds having a size comprised between 15 and 20 nanometers manufactured by the method comprising
    irradiating diamonds having a size above 0.1 micrometers grown by a high pressure and high temperature process and containing isolated substitutional nitrogen by an electron beam such that the irradiation dose is comprised between $10^{17}$ and $10^{19}$ electrons per square centimeter; wherein said electron beam has an acceleration energy above 7 MeV;
    annealing the irradiated diamonds in vacuum or in an inert atmosphere at a temperature above 700° C. and for at least 1 hour;
    after annealing, grinding said diamonds to nano-particles of diamonds having a size of less than 20 nanometers;

wherein each diamond contains 4 to 16 Nitrogen-Vacancy centres in a 20-nanometer particle or 10 Nitrogen-Vacancy centres in a 10-nanometer particle or 8 Nitrogen-Vacancy centres in a 15-nanometer particle.

2. The powder according to claim 1, wherein said electron beam has an acceleration energy below 15 MeV.

3. The powder according to claim 2, wherein said electron beam has an acceleration energy comprised between 8 and 10 MeV.

4. The powder according to claim 1, wherein, during irradiation, the temperature of diamonds is maintained at a temperature lower or equal to 80° C.

5. The powder according to claim 4, wherein said diamonds are cooled by a liquid stream circulating among said diamonds.

6. The powder according to claim 5, wherein said liquid is composed mainly of water.

7. The powder according to claim 1, wherein said annealing is carried out at a temperature comprised between 800° C. and 850° C.

8. The powder according to claim 7, wherein said annealing is carried out for less than 2 hours.

9. The powder according to claim 1, wherein said diamonds have a size above 150 micrometer for said irradiation.

10. A quantum cryptographic system comprising a light emitter comprising diamond manufactured by the method comprising:
   irradiating diamonds having a size above 0.1 micrometers grown by a high pressure and high temperature process and containing isolated substitutional nitrogen by an electron beam such that the irradiation dose is comprised between $10^{17}$ and $10^{19}$ electrons per square centimeter; wherein said electron beam has an acceleration energy above 7 MeV;
   annealing the irradiated diamonds in vacuum or in an inert atmosphere at a temperature above 700° C. and for at least 1 hour;
   after annealing, grinding said diamonds to nano-particles of diamonds having a size of less than 20 nanometers;
   wherein the diamond contains 4 to 16 Nitrogen-Vacancy centres in a 20-nanometer particle or 10 Nitrogen-Vacancy centres in a 10-nanometer particle or 8 Nitrogen-Vacancy centres in a 15-nanometer particle.

11. A single-particle biomarker comprising a nano-particle of diamond manufactured by the method comprising:
   irradiating diamonds having a size above 0.1 micrometers grown by a high pressure and high temperature process and containing isolated substitutional nitrogen by an electron beam such that the irradiation dose is comprised between $10^{17}$ and $10^{19}$ electrons per square centimeter; wherein said electron beam has an acceleration energy above 7 MeV;
   annealing the irradiated diamonds in vacuum or in an inert atmosphere at a temperature above 700° C. and for at least 1 hour;
   after annealing, grinding said diamonds to nano-particles of diamonds having a size of less than 20 nanometers;
   wherein the diamond contains 4 to 16 Nitrogen-Vacancy centres in a 20-nanometer particle or 10 Nitrogen-Vacancy centres in a 10-nanometer particle or 8 Nitrogen-Vacancy centres in a 15-nanometer particle.

* * * * *